United States Patent
Piret et al.

(10) Patent No.: US 7,634,711 B2
(45) Date of Patent: Dec. 15, 2009

(54) INFORMATION CODING BY ALGEBRAIC GEOMETRIC CODE OFFERING TWO DECODING OPTIONS

(75) Inventors: Philippe Piret, Cesson-Sevigne (FR); Frédéric Lehobey, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 331 days.

(21) Appl. No.: 10/825,283

(22) Filed: Apr. 16, 2004

(65) Prior Publication Data

US 2005/0015704 A1    Jan. 20, 2005

(30) Foreign Application Priority Data

Apr. 16, 2003    (FR) .................................. 03 04766

(51) Int. Cl.
*H03M 13/00* (2006.01)

(52) U.S. Cl. .................. 714/781; 714/794; 714/752

(58) Field of Classification Search .................. 714/781, 714/795, 794, 792, 752, 702, 790, 784, 793, 714/800; 375/262, 265
See application file for complete search history.

(56) References Cited

U.S. PATENT DOCUMENTS

| | | | | |
|---|---|---|---|---|
| 5,684,811 | A * | 11/1997 | Doran | 714/792 |
| 5,905,739 | A | 5/1999 | Piret et al. | 371/37.01 |
| 6,334,197 | B1 * | 12/2001 | Eroz et al. | 714/701 |
| 6,438,112 | B1 | 8/2002 | Piret et al. | 370/298 |
| 6,445,755 | B1 * | 9/2002 | Chung et al. | 375/341 |
| 6,543,021 | B1 | 4/2003 | Piret | 714/752 |
| 6,578,170 | B1 | 6/2003 | Piret et al. | 714/758 |
| 6,578,171 | B1 | 6/2003 | Braneci et al. | 714/786 |
| 6,638,318 | B1 | 10/2003 | Piret et al. | 718/781 |
| 6,675,348 | B1 * | 1/2004 | Hammons et al. | 714/790 |
| 6,766,489 | B1 | 7/2004 | Piret et al. | 714/755 |
| 7,051,267 | B1 * | 5/2006 | Yu et al. | 714/784 |
| 2002/0099997 | A1 | 7/2002 | Piret | 714/781 |

(Continued)

FOREIGN PATENT DOCUMENTS

EP    1047215 A    10/2000

OTHER PUBLICATIONS

R.E. Blahut, "Theory and Practice of Error Control Codes", Addison Wesley, US, XP002272857, pp. 119-123, Chapter 5.8: "The Binary Golay Code", May 1984.

(Continued)

*Primary Examiner*—Scott T Baderman
*Assistant Examiner*—Fritz Alphonse
(74) *Attorney, Agent, or Firm*—Fitzpatrick, Cella, Harper & Scinto

(57) ABSTRACT

The present invention concerns a method of coding information symbols according to a code defined on a Galois field $F_q$, where q is an integer greater than 2 and equal to a power of a prime number, and of length $n=p(q-1)$, where $p>1$. This coding is designed so that there exists a corresponding decoding method, also disclosed by the invention, in which the correction of transmission errors essentially comes down to the correction of errors in p words of length $(q-1)$ coded according to Reed-Solomon. The invention is particularly advantageous when, through a suitable choice of parameters, the code according to the invention is an algebraic geometric code: in this case, it is possible to correct the transmission errors by the method already mentioned and/or by a conventional method which is less economical but has a higher performance.

12 Claims, 3 Drawing Sheets

U.S. PATENT DOCUMENTS

| | | | | |
|---|---|---|---|---|
| 2002/0196862 A1* | 12/2002 | Dill et al. | ............... | 375/265 |
| 2003/0177430 A1 | 9/2003 | Piret | ............... | 714/751 |
| 2003/0188252 A1* | 10/2003 | Kim et al. | ............... | 714/779 |
| 2004/0117719 A1 | 6/2004 | Lehobey et al. | ............... | 714/781 |
| 2004/0194006 A1 | 9/2004 | Piret et al. | ............... | 714/800 |

OTHER PUBLICATIONS

R.E. Blahut, "Theory and Practice of Error Control Codes", Addison Wesley, US XP002272858, pp. 94-96, Chapter 5.1: "Viewing a Code from an Extension Field", May 1984.

J.H. van Lint, "Algebraic Geometric Codes", Coding Theory and Design Theory: Coding Theory, pp. 137-162, vol. 21, 1990.

T. Hoholdt et al., "On The Decoding of Algebraic-Gemotric codes", IEEE Transactions on Information Theory, IEEE Inc., New York, vol. 41, No. 6, pp. 1589-1614, Nov. 1995.

A.N. Skorobogatov et al., "On The Decoding of Algebraic-Geometric Codes", IEEE Transactions on Information Theory, IEEE Inc., vol. 36, No. 5, pp. 1051-1060, Sep. 1990.

M. A. Shokrollahi et al., "Decoding Algebraic-Geometric Codes Beyond the Error-Correction Bound", Proceedings of the 30$^{th}$ Annual ACM Symposium on Theory of Computing. Dallas, TX, May 23-26, 1998. Proceedings of the Annual ACM Symposium on Theory of Computing, New York, NY: ACM, US, May 23, 1998, pp. 241-248, XP000970906.

F. Gui-Liang et al., "A Simple Approach for Constructions of Algebraic-Geometric Codes from Affine Plane Curves", IEEE Transactions on Information Theory, IEEE, New York, pp. 1003-1012, vol. 40, No. 4, Jul. 1, 1994.

F. Gui-Lang et al., "Simplified Understanding and Efficient Decoding of a Class of Algebraic-Geometric Codes", IEEE Transactions on Information Theory, vol. 40, No. 4, pp. 981-1002, Jul. 1, 1994.

Chih-Wei Liu, et al., "A Fast Parallel Implementation of Feng-Rao Algorithm With Systolic Array Structure", Information Theory. 1997 IEEE International Symposium On ULM, p. 379, 1997, ISIT, '97, Jun. 29, 1997, XP 010239895.

Chih-Wei Liu, et. al., "A Systolic Array Implementation of the Feng-Rao Algorithm", IEEE Transactions on Computers, vol. 48, No. 7, pp. 690-706, Jul. 1999.

Feng G.L. et al., "Improved Geometric Goppa Codes. Part I: Basic Theory", IEEE Transactions on Information Theory, vol. 41, No. 6, pp. 1678-1693, Nov. 11, 1995.

T. Blackmore, et al., "Bounds on The State Complexity of Geometric Goppa Codes", ISIT 2000, Sorrento, Italy, p. 170, Jun. 25, 2000, XP010510047.

K. S. Laursen, "The Computational Complexity of Effective Construction of Geometric Goppa Codes", Information Theory, 1997. Proceedings. 1997 IEEE International Symposium On ULM, p. 380, , ISIT '97, Jun. 29, 1997, XP010239896.

K. Yang, et al., "On The Generalized Hamming Weights for Preparata codes Over Z4" Proceedings of the 1997 IEEE International Symposium on Information Theory, ISIT '97, p. 205, Jun. 29, 1997, XP000950795.

T. Helleseth, et al., "On The Coset Weight Distributions of the Z4-Linear Goethals Codes", Proceedings, 1998 IEEE International Symposium on Cambridge, MA, ISIT '98, p. 400, Aug. 1998, XP010296813.

T. Helleseth, et al., "The Algebraic Decoding of the Z4-Linear Goethals Code", IEEE Transactions on Information Theory, pp. 2040-2048, vol. 41, No. 6, Nov. 1995.

T. Helleseth, et al. "New Codes with The Same Weight Distributions as the Goethals Codes and the Delsarte-Goethals codes", Information Theory, 1995. Proceedings, 1995 IEEE International Symposium on Whistler, BC, Canada, p. 274, Sep. 17, 1995, XP01029266.

Helleseth T. et al. "Codes With The Same Weight Distributions As The Goethals Codes and The Delsarte-Goethals Codes", Designs, Codes and Cryptography, vol. 9, No. 3, pp. 257-266, 1996.

W. J. Reid III, et al. "Maximum Error Magnitude Decoding of the Golay Y23, 12, 7 Code", Information Theory, 1998. Proceedings, 1998 IEEE International Symposium on Cambridge, MA, ISIT '98, p. 219, Aug. 16, 1998, XP010297124.

P. Robertson, et al. "A Comparison of Optimal and Sub-Optimal Map Decoding Algorithms Operating in the Log Domain", Communications—Gateway to Globalization, Proceedings of the Conference on Communications, Seattle, IEEE, vol. 2, pp. 1009-1013, Jun. 18, 1995, XP000533149.

Gui-Liang Feng & T.R.N. Rao, "Decoding Algebraic-Geometric Codes up to the Designed Minimum Distance", IEEE Transactions on Information Theory, vol. 39, No. 1, pp. 37-45, Jan. 1993.

T. Hoholdt et al., Handbook of Coding Theory, Chapter 10: "Algebraic Geometry Codes", pp. 871-961, 1998.

H. Stichtenoth, "Algebraic Function Fields and Codes", Foundations of the Theory of Algebraic Function Fields, Chapter 1, Springer-Verlag, US, pp. 1-29, 1993.

\* cited by examiner

INFORMATION CODING BY ALGEBRAIC GEOMETRIC CODE OFFERING TWO DECODING OPTIONS

The present invention concerns communication systems in which, in order to improve the fidelity of the transmission, the data to be transmitted are subjected to a channel coding. It concerns more particularly on the one hand coding methods and on the other hand decoding methods as well as the devices and apparatus intended to implement these methods.

It will be recalled that coding known as "channel coding" consists, when the "code words" sent to the receiver are formed, of introducing a certain degree of redundancy in the data to be transmitted. More precisely, by means of each code word, the information initially contained in a predetermined number k of symbols taken from an "alphabet" of finite size q is transmitted; from these k information symbols a number n of symbols belonging to this alphabet are calculated, so as to form code words $\underline{v}=(v^0, v^u, \ldots, v^{n-1})$. All the code words obtained when each information symbol takes any value in the alphabet constitutes a kind of dictionary called a "code" of "dimension" k and "length" n.

When the size q of the alphabet is a power of a prime number, it is possible to give this alphabet a field structure, referred to as a "Galois field", denoted $F_q$, the non-zero elements of which can be conveniently identified as each being equal to $\gamma^{i-1}$ for a corresponding value of i, where $i=1, \ldots, q-1$, and where $\gamma$ is an element of $F_q$ chosen from amongst the so-called "primitive" elements of this field. In the case where the alphabet is a Galois field, some codes can, conveniently, be associated with a matrix H of dimension $(n-k) \times n$ defined on $F_q$, referred to as a "parity-check matrix": a word $\underline{v}$ of given length n is a code word if, and only if, it satisfies the equation: $H \cdot \underline{v}^T = 0$ (where the exponent T indicates the transposition); it is then said that the code is "orthogonal" to this matrix H. These codes, which are called "linear codes", will be the only codes considered below.

At the receiver, the associated decoding method then judiciously uses this redundancy to detect any transmission errors and if possible to correct them. There is a transmission error if the difference $\underline{e}$ between a received word $\underline{r}$ and the corresponding code word v sent by the sender is non-zero.

More precisely, the decoding takes place in two main steps.

The first step consists of associating an "associated code word" with the word received. To do this, the decoder first of all calculates the "error syndromes" vector $H \cdot \underline{r}^T = H \cdot \underline{e}^T$. If the syndromes are all zero, it is assumed that there has been no transmission error, and the "associated code word" will then simply be taken to be equal to the word received. If such is not the case, it is deduced from this that some symbols in the word received are erroneous, and a correction algorithm is then implemented intended to estimate the value of the error $\underline{e}$; the algorithm will thus supply an estimated value $\hat{\underline{e}}$ so that $(\underline{r}-\hat{\underline{e}})$ is a code word, which will then constitute the "associated code word".

The second step consists simply of reversing the coding process. In the ideal situation where all the transmission errors have been corrected, the initial information symbols are thus found.

The task of an error correction algorithm is to associate with the word received the code word situated at the shortest Hamming distance from this word received, the "Hamming distance" being, by definition, the number of locations where two words with the same length have a different symbol. The shortest Hamming distance between two different words of a code is called the "minimum distance" d of this code. This is an important parameter of the code. More precisely, it is in principle possible to find the position of any errors in a word received, and to provide the correct replacement symbol (that is to say the one identical to that sent by the sender) for each of these positions, whenever the number of erroneous positions is no more than $INT[(d-1)/2]$ (where "INT" designates the integer part) for a code of minimum distance d (with some error configurations, it is even sometimes possible to do better). In all cases however, it is only a possibility in principle, since it is often difficult to develop a decoding algorithm achieving this performance. It should also be noted that, when the chosen algorithm succeeds in a proposing a correction for the word received, this correction is all the more reliable (at least, for the majority of transmission channels) when it concerns a smaller number of positions.

The capability of an error correction algorithm for proposing a correction of a word received is faithfully represented by the formula:

$$2\epsilon \leq \Delta,$$

where $\epsilon$ is the number of erroneous symbols in the word received, and $\Delta$ is a strictly positive integer which will be termed the "solving capability" of the algorithm. If the value of ($2\epsilon$) is less than or equal to the solving capability, the correction algorithm will be capable of correcting the word received. If the value of ($2\epsilon$) is greater than the solving capability, the algorithm may:

either fail purely and simply in its correction attempt,
or be capable of proposing a correction of the word received; in this case, if this correction is accepted, there is a risk that it may be erroneous, that is to say the code word proposed may not in fact be the word sent, this risk obviously being all the more pronounced when ($2\epsilon$) is large compared with $\Delta$.

Having regard to the above considerations concerning the minimum distance d of the code, it will be stated that the algorithm in question is "maximal" if $$\Delta = d-1,$$

and "sub-maximal" if $$\Delta < d-1.$$

Amongst the known codes, the "Reed-Solomon codes" can be cited, which are renowned for their efficacy (for a definition of Reed-Solomon codes, reference can be made to the work by R. E. Blahut entitled *"Theory and Practice of Error-Control Codes"*, Addison-Wesley, Reading, Mass., 1983). These codes are defined on $F_q$, and their minimum distance d is equal to ($n-k+1$). For decoding them, use is normally made of a so-called "Berlekamp-Massey" algorithm for detecting erroneous positions in a word received, and a so-called "Formey" algorithm for correcting the corresponding erroneous symbols (these algorithms are described in the work mentioned above).

In modern information media, for example in computer hard disks, CDs ("compact disks") or DVDs ("digital video disks"), it is sought to increase the information density. When such a medium is affected by a physical defect such as a scratch, a large number of information symbols may be made illegible. This problem can however be remedied by using a very long code. However, Reed-Solomon codes have the particularity that the length n of the code words is necessarily less than or equal to the size q of the alphabet of the symbols. In fact, when it is sought, for fixed q, to maximize the length of the Reed-Solomon code, it may be preferred to take a length n equal to ($q-1$) rather than equal to q: this is because, as explained in the work by R. E. Blahut cited above, it is simpler to decode a Reed-Solomon code of length (q−1) defined on $F_q$ than a code of length q (still defined on $F_q$), so that this slight loss of length is compensated for by a gain in ease of decoding; in this case, the parity-check matrix $H^{(t)}$, where t=n−k, of the Reed-Solomon code is a matrix with t rows and (q−1) columns, which can be defined by taking $H^{(t)}_{ij}=\gamma^{i(j-1)}$ (1≤i≤t, 1≤j≤q−1), where γ is a primitive element of $F_q$.

Consequently, if it is wished to have a Reed-Solomon code having very long code words, it is necessary to envisage high values of q, which results in expensive implementations with regard to calculations and storage. In addition, high values of q are sometimes unsuited to the technical application envisaged. This is why it has been sought to construct codes offering, in a natural manner, a greater length of words than Reed-Solomon codes.

In particular, so-called "algebraic geometric codes" or "geometric Goppa codes" have been proposed recently (see for example *"Algebraic Geometric Codes"*, by J. H. van Lint, in *"Coding Theory and Design Theory"*, Part 1, *IMA Volumes Math. Appl.*, Volume 21, Springer-Verlag, Berlin, 1990). These codes, also defined on a Galois field $F_q$, are constructed from an algebraic equation with two unknowns X and Y. The solutions of this algebraic equation can be considered to be the coordinates (x,y) of points on an "algebraic curve". To define a parity-check matrix, first of all an ordered set is set up, called a "locating set", from n such points, all of whose coordinates are finite; then each row in the parity-check matrix is obtained by evaluating a well-chosen function of X and Y in each element of this locating set. In this way an algebraic geometric code of length n is obtained.

An important parameter of such a curve is its "genus" g. In the particular case where the curve is a simple straight line (the genus g is then zero), the algebraic geometric code is reduced to a Reed-Solomon code. In some cases, the algebraic geometric codes make it possible to achieve a length equal to $(q+2g\sqrt{q})$, which may be very high; for example, with an alphabet size equal to 256 and a genus equal to 120, code words of length 4096 are obtained. It should also be noted that the algebraic geometric codes have a minimum distance d greater than or equal to (n−k+1−g).

Like all the codes, algebraic geometric codes may be "shortened". It is said that a given code is a "shortened" version of the code C if it comprises only the words of C where, for a number R of predetermined positions, the components are all zero: these positions being known to the receiver, it is possible to dispense with transmitting them, so that the shortened code is of length (n−R). In particular, it is normal to shorten an algebraic geometric code by eliminating, from the locating set, where necessary, a point, or several points, whose x coordinate is zero.

Algebraic geometric codes are advantageous with regard to their minimum distance and, as stated, with regard to the length of the code words, but they have the drawback of requiring decoding algorithms which are fairly complex and therefore fairly expensive in terms of equipment (software and/or hardware) and processing time. This complexity is in fact more or less great according to the algorithm in question, a greater complexity being in principle the price to be paid for increasing the error correction capacity of the decoder (see for example the article by Tom Høholdt and Ruud Pellikaan entitled *"On the Decoding of Algebraic-Geometric Codes"*, IEEE Trans. Inform. Theory, Vol. 41, No. 6, pages 1589 to 1614, November 1995).

The aim of the invention is, inter alia, to propose a code for correcting a relatively high number of transmission errors in an economical manner.

The invention thus concerns, according to a first aspect, a method of coding information symbols according to a code defined on a Galois field $F_q$, where q is an integer greater than 2 and equal to a power of a prime number, and of length n=p(q−1), where p is an integer greater than 1, said method being notable in that it comprises the following steps:

a) a p-tuple of integers $(t_1, \ldots, t_p)$ is chosen such that $$q-1 > t_1 > t_2 > \ldots > t_p > 0,$$

and a p-tuple of diagonal square matrices $(Y_1, \ldots, Y_p)$ of dimension (q−1) on $F_q$ such that, for any i(1≤i≤q−1), the p elements in position (i,i) of these matrices $Y_1, \ldots, Y_p$ are different in pairs, b) said information symbols are placed successively in p words $\underline{a}_l$ of length $(q-1-t_l)$ (where l=1, …, p), c) words $\underline{u}_l$ (where l=1, …, p) are formed of length (q−1), which constitute the components of the "precoded word" $\underline{u}=[\underline{u}_1 \underline{u}_2 \ldots \underline{u}_p]$, by supplementing the corresponding word $\underline{a}_l$, by means of redundant symbols so that $\underline{u}_l$ is orthogonal to the matrix $H^{(t_l)}$, where the matrices $H_{(t)}$ are defined by $H^{(t)}_{ij}=\gamma^{i(j-1)}$(1≤i≤t, 1≤j≤q−1), where γ is a symbol chosen from amongst the primitive elements of $F_q$, and d) a code word $$\underline{v}=[\underline{v}_1 \underline{v}_2 \ldots \underline{v}_p]$$

is formed, where each word $\underline{v}_l$ (l=1, …, p) is of length (q−1), by resolving the system of equations $$\begin{cases} \underline{v}_1 + \underline{v}_2 + \ldots + \underline{v}_p = \underline{u}_1, \\ \underline{v}_1 Y_1 + \underline{v}_2 Y_2 + \ldots + \underline{v}_p Y_p = \underline{u}_2, \\ \underline{v}_1 Y_1^2 + \underline{v}_2 Y_2^2 + \ldots + \underline{v}_p Y_p^2 = \underline{u}_3, \\ \ldots \\ \underline{v}_1 Y_1^{p-1} + \underline{v}_2 Y_2^{p-1} + \ldots + \underline{v}_p Y_p^{p-1} = \underline{u}_p. \end{cases}$$

Correspondingly, the invention concerns, according to the same first aspect, a method of receiving data received resulting from the transmission of symbols coded in the manner described succinctly above, said method being notable in that it comprises the following steps:

e) from the word received $$\underline{r}=[\underline{r}_1 \underline{r}_2 \ldots \underline{r}_p]$$

where each word $\underline{r}_l$ (l=1, …, p) is of length (q−1), at least one of the components $\underline{s}_l$ (where l=1, …, p) of length (q−1), of the "post-received word" $\underline{s}=[\underline{s}_1 \underline{s}_2 \ldots \underline{s}_p]$ is calculated, according to:

$$\begin{cases} \underline{s}_1 = \underline{r}_1 + \underline{r}_2 + \ldots + \underline{r}_p, \\ \underline{s}_2 = \underline{r}_1 Y_1 + \underline{r}_2 Y_2 + \ldots + \underline{r}_p Y_p, \\ \underline{s}_3 = \underline{r}_1 Y_1^2 + \underline{r}_2 Y_2^2 + \ldots + \underline{r}_p Y_p^2, \\ \ldots \\ \underline{s}_p = \underline{r}_1 Y_1^{p-1} + \underline{r}_2 Y_2^{p-1} + \ldots + \underline{r}_p Y_p^{p-1}, \end{cases}$$

and f) at least one of the components $\hat{\underline{u}}_l$ (where l=1, …, p) of length (q−1), of the "post-associated word" $\hat{\underline{u}}=[\hat{\underline{u}}_1 \hat{\underline{u}}_2 \ldots \hat{\underline{u}}_p]$, is calculated, correcting the word $\underline{s}_l$ with the same l according to the error syndrome vector $H^{(t_l)} \cdot \underline{s}_l^T$.

Thus the correction of transmission errors in the coded words according to the invention essentially comes down to the correction of errors in p words coded according to Reed-Solomon. The correction of errors for each of these p components is relatively simple and rapid by virtue of the qualities of the known algorithms adapted to the Reed-Solomon codes, all the more so since the words of length (q−1) defined on $F_q$ are corrected, as explained above.

According to particular characteristics, an algebraic equation in X and Y is considered such that, for any value $\gamma^{i-1}$ (i=1,...,q−1) taken by X, said algebraic equation has p distinct solutions denoted $y_l(\gamma^{i-1})$ (where l=1,...,p), and the diagonal element in position (i,i) of each of said matrices $Y_l$ is taken to be equal to $y_l(\gamma^{i-1})$.

In this case, the code according to the invention is an algebraic geometric code, orthogonal to the parity-check matrix:

$$H = \begin{bmatrix} H^{(t_1)} & H^{(t_1)} & \ldots & H^{(t_1)} \\ H^{(t_2)}Y_1 & H^{(t_2)}Y_2 & \ldots & H^{(t_2)}Y_p \\ H^{(t_3)}Y_1^2 & H^{(t_3)}Y_2^2 & \ldots & H^{(t_3)}Y_p^2 \\ & & \ldots & \\ H^{(t_p)}Y_1^{p-1} & H^{(t_p)}Y_2^{p-1} & \ldots & H^{(t_p)}Y_p^{p-1} \end{bmatrix}.$$

This particular choice offers several additional advantages. Three of them merit in particular to be mentioned. Firstly, there is the benefit of the great minimum distance guaranteed by algebraic geometric codes.

Secondly, for these codes, error correction algorithms such as the Feng-Rao algorithm, are known, able to take the best possible advantage of this great minimum distance (although the minimum distance of the code according to the invention is not always exactly known, it will be considered that the Feng-Rao algorithm is in practice "maximal" within the meaning defined above). Thus, correspondingly, the invention concerns a method of decoding received data resulting from the transmission of coded symbols according to the particular embodiment described succinctly above, said method being notable in that it comprises the following steps:

e') a maximal error correction algorithm is applied to each received word $\underline{r}$, so as to obtain an estimation $$\hat{\underline{v}} = [\hat{\underline{v}}_1 \, \hat{\underline{v}}_2 \, \hat{\underline{v}}_p]$$

where each word $\underline{v}_l$ (l=1,...,p) is of length (q−1), of the corresponding transmitted word $\underline{v}$, and f') at least one of the components $\hat{\underline{u}}_l$ (where l=1,...,p), of length (q−1), of the "post-associated word" $\hat{\underline{u}} = [\hat{\underline{u}}_1 \, \hat{\underline{u}}_2 \ldots \hat{\underline{u}}_p]$, is calculated, according to:

$$\begin{cases} \hat{u}_1 = \hat{v}_1 + \hat{v}_2 + \ldots + \hat{v}_p, \\ \hat{u}_2 = \hat{v}_1 Y_1 + \hat{v}_2 Y_2 + \ldots + \hat{v}_p Y_p, \\ \hat{u}_3 = \hat{v}_1 Y_1^2 + \hat{v}_2 Y_2^2 + \ldots + \hat{v}_p Y_p^2, \\ \ldots \\ \hat{u}_p = \hat{v}_1 Y_1^{p-1} + \hat{v}_2 Y_2^{p-1} + \ldots + \hat{v}_p Y_p^{p-1}. \end{cases}$$

Thirdly, it should be noted that a person skilled in the art normally chooses a particular coding/decoding rather than another, according in particular to the specification (cost, reliability) of the application envisaged. However, this choice proves difficult in the case where this application concerns a channel in which the noise level varies greatly over time; likewise, a manufacturer of coding and decoding devices has difficulty in fixing the characteristics of his product if he does not know, at the manufacturing stage, whether this product will subsequently be used in high- or low-noise channels. This is because of the following dilemma: if the decoding method comprises a high-performance error correction algorithm, it will prove to be too expensive if, once the transmission has commenced, it is found that the transmission error rate is appreciably lower than expected; if on the other hand the decoding method comprises an error correction algorithm which is economical but of average performance, the transmission will suffer from an excessive rate of uncorrected errors if, once the transmission has commenced, it is found that the transmission error rate is appreciably higher than expected.

The embodiment of the invention succinctly described above resolves this problem by making it possible to correct the words received, as required, either using a maximal algorithm or using the sub-maximal algorithm, described succinctly above, having recourse to p algorithms adapted to Reed-Solomon codes (it will be said that either a "maximal decoding method" or a "sub-maximal decoding method" is applied to the current word received, respectively). This advantage of the algebraic geometric code according to the invention can possibly, moreover, extend to the code according to the invention in its most general form, as described succinctly above, if it turns out that there exists a maximal error correction algorithm adapted to this code.

It is possible, in practice, to make use of this advantage in various ways.

Thus, according to particular characteristics, the decoding method can comprise a preliminary step consisting of choosing, for the current word received, between the steps of the "sub-maximal" decoding method and the steps of the "maximal" decoding method, as described succinctly above, according to predetermined criteria, for example an estimation of the channel noise.

According to other particular characteristics, the decoding method can, for any word received, first of all implement the steps of the "sub-maximal method" and, where this method does not succeed, declare that a non-correctable error has been detected, and/or then implement the steps of the "maximal method". This is because, as mentioned above, an error correction algorithm may prove to be incapable of proposing a corrected word when the number of errors is too high having regard to its solving capability.

Whatever the decoding method, as described succinctly above, used, it will then be possible to obtain estimated information symbols by removing from at least one component $\hat{\underline{u}}_l$ (l=1,...,p) the symbols situated at the identical positions to the positions of the component $\underline{u}_l$ with the same l of the corresponding precoded word $\underline{u}$, in which the redundant symbols were placed at step c) of the coding according to the invention. In this way an estimation of the information symbols contained in the corresponding word $\underline{a}_l$, is obtained.

It should be noted in this regard that the invention conveniently offers the possibility of decoding only the information symbols contained in some of the words forming the block $\underline{a}$, which may be economically advantageous for some applications. This is for example the case when the information to be transmitted represents images coded at the source according to a series of approximations of different resolutions. Thus, in the method of coding at source called "decomposition into sub-bands", each image to be transmitted is divided into several hierarchical data blocks (called "sub-bands"), and this iteratively; for example, at the first iteration, four sub-bands are created: the first contains the low frequencies of the image, the second the horizontal high frequencies, the third the vertical high frequencies and the fourth the diagonal high frequencies, each sub-band containing one quarter of the data (pixels) of the original image; at the second iteration, the low-frequency sub-band is itself decomposed into four new blocks containing the low frequencies, the horizontal high frequencies, the vertical high frequencies and the diagonal frequencies relating to this sub-band; the decomposition process is thus continued a certain number of times according to requirements. During the channel coding according to the invention, it is then possible to make the word $\underline{a}_1$ correspond to the lowest frequencies of the image (which contribute most to the intelligibility of the image, and therefore require the greatest protection vis-à-vis transmission errors), the word $\underline{a}_2$ to the higher frequencies, the word $\underline{a}_3$ to the even higher frequencies, and so on; it will then be possible, according to the quality of service required by the communication system or by the destination of the images, to calculate only the component $\hat{u}_1$ of the post-associated word, or to calculate only the components $\hat{u}_1$ and $\hat{u}_1$, or to calculate only the components $\hat{u}_1$, $\hat{u}_2$ $\hat{u}_3$ and so on, before extracting therefrom the corresponding estimated information symbols. Another exemplary application is found in the coding of images at source according to the so-called "wavelet" method, as defined by the JPEG-2000 standard.

The invention also concerns, according to the same first aspect, a method of communicating information symbols comprising the following steps:

1) the said information symbols are coded in accordance with one of the coding methods succinctly described above, so as to form the code words $$\underline{v}=(v^0, v^1, \ldots, v^{n-1}),$$

2) the symbols of each code word $\underline{v}$ are permuted so as to form a word to be transmitted $$\underline{v}^*=(v^0, v^{q-1}, v^{2(q-1)}, \ldots, v^{(p-1)(q-1)}, v^1, v^q, v^{2q-1}, \ldots, v^{(p-1)(q-1)+1}, \ldots, v^{n-1})$$

3) said word $\underline{v}^*$ is transmitted,
4) an interleaved word $$\underline{r}^*=(r^0, r^{q-1}, r^{2(q-1)}, \ldots, r^{(p-1)(q-1)+1}, \ldots, r^{n-1})$$

corresponding to the word v*is received,
5) the symbols of the interleaved word $\underline{r}^*$are permuted so as to form a received word $\underline{r}=(r^0, r^1, \ldots, r^{n-1})$, and
6) the received word r is decoded in accordance with one of the decoding methods succinctly described above, adapted to said coding method.

In addition to the advantages of the corresponding coding and decoding methods, this communication method offers, through the combination of an interleaving and a reverse deinterleaving of this interleaving, a limitation of the propagation of errors in the event of an error burst during the transmission of the coded symbols (a burst is a series of errors of high frequency with respect to the mean error frequency on the channel in question; such bursts are observed both on certain radio transmissions and on certain recordings on hard disk). This is because an error burst affecting bp symbols of $\underline{v}^*$during transmission will effect at most (b+1) symbols in each of the words $\underline{u}_l$ (where l=1, . . . , p), whilst without interleaving each of these words $\underline{u}_l$ will suffer bp transmission errors.

According to a second aspect, the invention concerns various devices.

The invention thus concerns, firstly, a device for coding information symbols according to a code defined on a Galois field $F_q$, where q is an integer greater than 2 and equal to a power of a prime number, and of length n=p(q−1), where p is an integer greater than 1, said device being notable in that, a p-tuple of integers $(t_1, \ldots, t_p)$ such that $$q-1>t_1>t_2>\ldots>t_p>0,$$

and a p-tuple of diagonal square matrices $(Y_1, \ldots, Y_p)$ of dimension (q−1) on $F_q$ such that, for any i(1≦i≦q−1), the p elements in position (i,i) of these matrices $Y_1, \ldots, Y_p$ are different in pairs, having been chosen, it is able to:
  place said information symbols successively in p words $\underline{a}_l$ of length (q−1−$t_l$) (where l=1, . . . , p),
  form words $\underline{u}_l$ (where l=1, . . . , p) of length (q−1), which constitute the components of the "precoded word" $\underline{u}=[\underline{u}_1 \underline{u}_2 \ldots \underline{u}_p]$, supplementing the corresponding word $\underline{a}_l$ by means of redundant symbols so that $\underline{u}_l$ is orthogonal to the matrix $H^{(t_l)}$, where the matrices $H^{(t)}$ are defined by $H^{(t)}_{ij}=\gamma^{i(j-1)}$(1≦i≦t, 1≦j≦q−1), where γ is a symbol chosen from amongst the primitive elements of $F_q$, and
  form a code word $$\underline{v}=[\underline{v}_1\underline{v}_2\ldots\underline{v}_p],$$

where each word $\underline{v}_l$ (l=1, . . . , p) is of length (q−1), by resolving the system of equations $$\begin{cases} \underline{v}_1 + \underline{v}_2 + \ldots + \underline{v}_p = \underline{u}_1, \\ \underline{v}_1 Y_1 + \underline{v}_2 Y_2 + \ldots + \underline{v}_p Y_p = \underline{u}_2, \\ \underline{v}_1 Y_1^2 + \underline{v}_2 Y_2^2 + \ldots + \underline{v}_p Y_p^2 = \underline{u}_3, \\ \ldots \\ \underline{v}_1 Y_1^{p-1} + \underline{v}_2 Y_2^{p-1} + \ldots + \underline{v}_p Y_p^{p-1} = \underline{u}_p. \end{cases}$$

According to particular characteristics, this device is also able to assign the value $y_l(\gamma^{i-1})$ to the diagonal element in position (i,i) of each of said matrices $Y_l$, where, for a predetermined algebraic equation in X and Y, said algebraic equation has p distinct solutions denoted $y_l(\gamma^{i-1})$ (where l=1, . . . , p) for any value $\gamma^{i-1}$(i=1, . . . , q−1) taken by X.

The invention also concerns, secondly, a device for decoding received words $\underline{r}$ resulting from the transmission of coded words $\underline{v}$ according to the invention, said device being notable in that it comprises:
  an error correction unit able to apply an errorcorrection algorithm to each word received $\underline{r}$, so as to supply at least one component $\hat{\underline{u}}_l$ (where l=1, . . . , p) of a "post-associated word" $\hat{\underline{u}}$, and
  a redundancy elimination unit able to remove from said component $\hat{\underline{u}}$ the symbols situated at the positions identical to the positions of the component $\hat{\underline{u}}$ with the same l of the corresponding precoded word $\underline{u}$, in which redundant symbols were placed at the time of coding.

When the code used is an algebraic geometric code according to the invention, this device will also be able to comprise a selection unit capable of determining, according to predetermined criteria, whether it is necessary to apply to the current received word $\underline{r}$ a "sub-maximal decoding method" and/or a "maximal decoding method" as described succinctly above.

The advantages of these devices are essentially the same as those of the corresponding coding and decoding methods succinctly described above.

The invention also relates to:
  an information data transmission apparatus comprising a coding device as succinctly described above, as well as a modulator for modulating the data resulting from the coding of said information data, a data reception apparatus comprising a demodulator for demodulating the received data, as well as a decoding device as succinctly described above;

an information data transmission apparatus comprising a coding device as succinctly described above, an interleaver able to permute the symbols of each code word $\underline{v}^*=(v^0,v^1,\ldots,v^{n-1})$ so as to form a word to be transmitted $$\underline{v}^*=(v^0,v^{q-1},v^2(q-1),\ldots,v^{(p-1)(q-1)},v^1,v^q,$$
$$v^{2q-1},\ldots,v^{(p-1)(q-1)+1},\ldots,v^{n-1}).$$

and a modulator for modulating the symbols of said word to be transmitted $\underline{v}^*$ a data reception apparatus comprising a demodulator for demodulating the received data so as to form interleaved received words $$\underline{r}^*=(r^0,r^{q-1},r^2(q-1),\ldots,r^{(p-1)(q-1)},r^1,r^q,$$
$$v^{2q-1},\ldots,r^{(p-1)(q-1)+1},\ldots,r^{n-1}).$$

where q is an integer greater than 2 and equal to a power of a prime number, p being an integer greater than 1, and n=p(q−1), a deinterleaver for permuting the symbols of each interleaved received word $\underline{r}^*$so as to form a received word $\underline{r}=(r^0,r^1,\ldots,r^{n-1})$, and a decoding device as succinctly described above, a non-removable data storage means comprising computer program code instructions for executing the steps of any one of the coding and/or decoding and/or communication methods succinctly disclosed above, a partially or totally removable data storage means, comprising computer program code instructions for executing the steps of any one of the coding and/or decoding and/or communication methods succinctly disclosed above, and a computer program containing instructions such that, when said program controls a programmable data processing device, said instructions mean that the data processing device implements one of the coding and/or decoding and/or communication methods succinctly disclosed above.

The advantages offered by such transmission apparatus, such reception apparatus, such data storage means and such a computer program are essentially the same as those offered by the coding, decoding and communication methods according to the invention.

The invention also relates to a method of decoding received symbols, characterized in that it comprises the steps of:
determining a current state of transmission;
selecting one of a plurality of available decoding algorithms in accordance with the current state of the transmission determined in said determining step; and
decoding the received symbols by using the selected decoding algorithm.

This decoding method offers an appropriate decoding algorithm in accordance with the current state of the transmission.

Other aspects and advantages of the invention will emerge from a reading of the following detailed description of particular embodiments, given by way of non-limiting examples. The description refers to the drawings which accompany it, in which:

FIG. 1 is a block diagram of an information transmission system implementing a communication method according to one embodiment of the invention.

Figure 1:
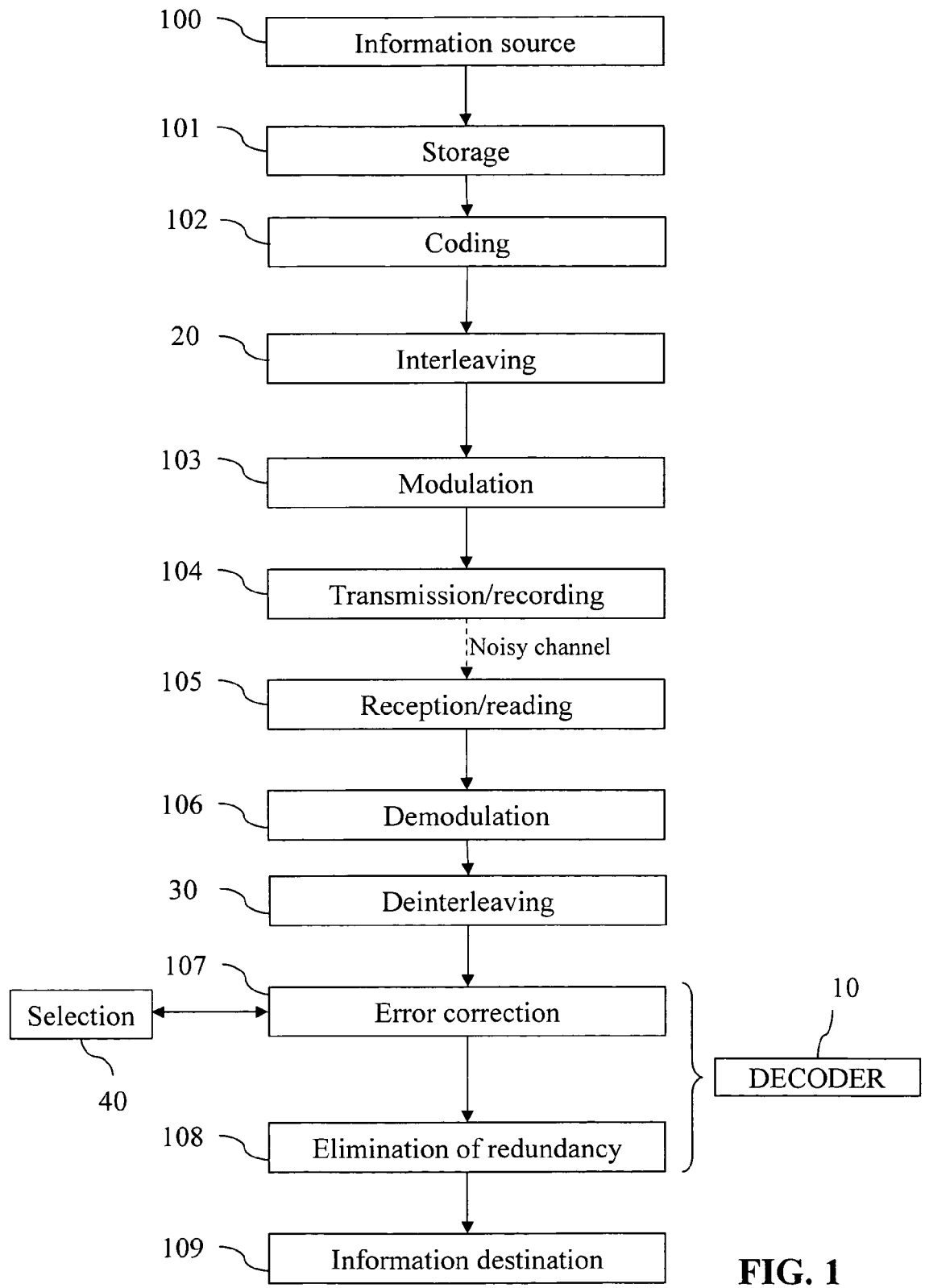
FIG. 1 is a block diagram of an information transmission system according to one embodiment of the invention.

The function of this system is to transmit information of any nature from a source 100 to a destination or user 109. Firstly, the source 100 puts this information in the form of symbols belonging to a certain alphabet (for example bytes of bits in the case where the size q of the alphabet is equal to 256), and transmits these symbols to a storage unit 101, which accumulates the symbols so as to form sets each containing k symbols. Next, each of these sets is transmitted by the storage unit 101 to a coding unit 102, which constructs a word $\underline{v}$ orthogonal to the parity-check matrix H.

The coding and decoding methods according to the invention will now be illustrated by means of a numerical example. It should be noted that this example does not necessarily constitute a preferential choice of parameters for coding or decoding. It is provided here only to enable a person skilled in the art to understand more easily the functioning of the invention.

Consider therefore an algebraic geometric code of length 1020 and dimension 916 defined, in a conventional manner, as follows.

The alphabet of the symbols consists of the $2^8$ elements of the Galois field $F_{256}$ (that is to say bytes of binary symbols) (this field can be constructed by means of the polynomial $(X^8+X^4+X^3+X^2+1)$ defined on $F_2$).

The algebraic-curve of genus g=24 consisting of all the solutions in $F_{256}$ of the equation with two unknowns is then considered $$Y^4+Y=X^{17}.$$

For any value taken by X in $F_{256}$, the p=4 solutions of the corresponding equation in Y are also in $F_{256}$. These solutions (XY) define the "points on the curve" associated with this equation on $F_{256}$. This curve therefore comprises 1024 points of finite coordinates (and a point at infinity $P_\infty$) In this set, the four solutions of the equation for which X=0 are eliminated so as to construct "shortened" codes. All the points $P_j$(where j= 1, ..., 1020) remaining will therefore constitute the locating set, each point $P_j$ serving to identify the j-th element of any code word.

Next, the vector space $L(mP_\infty)$ of polynomials in X and Y with coefficients in $F_{256}$ are considered, where the only poles are situated in $P_\infty$, and are of order less than or equal to m, where m is a strictly positive integer (it is therefore an algebraic geometric code said to be "with one point"). This vector space, which is of dimension greater than or equal to (m−g+1) (equal if m≧2g−2), has a base consisting of the monomials $(X^rY^s)$, where r is a positive or zero integer, s is an integer between 0 and 3, and: 17s+4r≦m.

A parity-check matrix H' is conventionally defined as follows: the element on row i and column j of this matrix is equal to the i-th monomial of said base (with 1≦i≦m+g+1) evaluated at point $P_j$(with j=1, ..., 1020) of the algebraic curve. Take for example: m=127; then n−k=104 is obtained, and therefore k=916.

In fact, it would be more convenient to define the code by means of a matrix H a little different from H' and which is written:

$$H = \begin{bmatrix} H^{(32)} & H^{(32)} & H^{(32)} & H^{(32)} \\ H^{(28)}Y_1 & H^{(28)}Y_2 & H^{(28)}Y_3 & H^{(28)}Y_4 \\ H^{(24)}Y_1^2 & H^{(24)}Y_2^2 & H^{(24)}Y_3^2 & H^{(24)}Y_4^2 \\ H^{(20)}Y_1^3 & H^{(20)}Y_2^3 & H^{(20)}Y_3^3 & H^{(20)}Y_4^3 \end{bmatrix}, \quad (1)$$

where $$H^{(t)} \equiv \begin{bmatrix} 1 & \gamma & \gamma^2 & \gamma^3 & \ldots & \gamma^{254} \\ 1 & \gamma^2 & \gamma^4 & \gamma^6 & \ldots & \gamma^{253} \\ \vdots & \vdots & \vdots & \vdots & \vdots & \vdots \\ 1 & \gamma^t & \gamma^{2t} & \gamma^{3t} & \ldots & \gamma^{255-t} \end{bmatrix}, \quad (2)$$

and each matrix $Y_l$ is defined as being the diagonal square matrix of dimension 255 whose element in position (i,i) is equal to $y_l(y^{i-1})$. The code orthogonal to the matrix H' is different from the code orthogonal to the matrix H, but it is equivalent to it in the sense that each word of the first code is identical to a single word in the second code multiplied by a diagonal matrix Z, of size 1020×1020, such that $Z_{ii} = \gamma^{i-1}$ (i=1, . . . , 1020).

A description will now be given of the way in which, according to this embodiment of the invention, the coding unit 102 constructs a word $\underline{v}$ orthogonal to the above parity-check matrix H.

The coding unit 102 first of all forms information blocks $\underline{a}$ of length k=916, drawing on successive symbols in the storage unit 101, these blocks $\underline{a}$ being structured in four words according to $$\underline{a} = [\underline{a}_1 \ \underline{a}_2 \ \underline{a}_3 \ \underline{a}_4],$$

where the word $\underline{a}_1$, is of length 223, the word $\underline{a}_2$ is of length 227, the word $\underline{a}_3$ is of length 231 and the word $a_4$ is of length 235.

A "precoded word"

$$\underline{u} = [\underline{u}_1 \ \underline{u}_2 \ \underline{u}_3 \ \underline{u}_4],$$

is then formed in the following manner: the word $\underline{u}_1$ of length 255 is obtained by supplementing $\underline{a}_1$ with redundant symbols so that:

$$H^{(32)} \cdot \underline{u}_1^T = 0, \quad (3a)$$

and the word $\underline{u}_2$ of length 255 by supplementing $\underline{a}_2$ with redundant symbols so that:

$$H^{(28)} \cdot \underline{u}_2^T = 0, \quad (3b)$$

and the word $\underline{u}_3$ of length 255 by supplementing $\underline{a}_3$ with redundant symbols so that:

$$H^{(24)} \cdot \underline{u}_3^T = 0, \quad (3c)$$

and finally the word $u_4$ of length 255 by supplementing $a_4$ with redundant symbols so that:

$$H^{(20)} \cdot \underline{u}_4^T = 0, \quad (3d)$$

Consider then the words $$\underline{v} = [\underline{v}_1 \underline{v}_2 \underline{v}_3 \underline{v}_4],$$

where the words $\underline{v}_1$, $\underline{v}_2$, $\underline{v}_3$, and $\underline{v}_4$ are all four of length 255 and obey the following system of equations:

$$\begin{cases} \underline{v}_1 + \underline{v}_2 + \underline{v}_3 + \underline{v}_4 = \underline{u}_1, \\ \underline{v}_1 Y_1 + \underline{v}_2 Y_2 + \underline{v}_3 Y_3 + \underline{v}_4 Y_4 = \underline{u}_2, \\ \underline{v}_1 Y_1^2 + \underline{v}_2 Y_2^2 + \underline{v}_3 Y_3^2 + \underline{v}_4 Y_4^2 = \underline{u}_3, \\ \underline{v}_1 Y_1^3 + \underline{v}_2 Y_2^3 + \underline{v}_3 Y_3^3 + \underline{v}_4 Y_4^3 = \underline{u}_4. \end{cases} \quad (4)$$

It can easily be verified that these words $\underline{v}$ are orthogonal to the matrix H of equation (1): these are therefore indeed code words associated with H.

The matrices Y, being regular, the system of equations (4) always has a single solution, which is given by:

$$\underline{v}_1 K_1 = \underline{u}_1 Y_2 Y_3 Y_4 + \underline{u}(Y_2 Y_3 + Y_3 Y_4 + Y_4 Y_2) + \underline{u}_3(Y_2 + Y_3 + Y_4) + \underline{u}_4, \quad (5a)$$

$$\underline{v}_2 K_2 = \underline{u}_1 Y_1 Y_3 Y_4 + \underline{u}(Y_1 Y_3 + Y_3 Y_4 + Y_4 Y_1) + \underline{u}_3(Y_1 + Y_3 + Y_4) + \underline{u}_4, \quad (5b)$$

$$\underline{v}_3 K_3 = \underline{u}_1 Y_1 Y_2 Y_4 + \underline{u}(Y_1 Y_2 + Y_2 Y_4 + Y_4 Y_1) + \underline{u}_3(Y_1 + Y_2 + Y_4) + \underline{u}_4, \quad (5c)$$

$$\underline{v}_4 K_1 = \underline{u}_1 Y_1 Y_2 Y_3 + \underline{u}(Y_1 Y_2 + Y_2 Y_3 + Y_3 Y_1) + \underline{u}_3(Y_1 + Y_2 + Y_3) + \underline{u}_4, \quad (5d)$$

where $$K_1 = Y_2 Y_3 Y_4 + Y_1(Y_2 Y_3 + Y_3 Y_4 + Y_4 Y_2) + Y_1^2(Y_2 + Y_3 + Y_4) + Y_1^3, \quad (6)$$

and $K_2$, $K_3$ and $K_4$ are obtained by circular permutation of the indices of the matrices $Y_l$.

In this embodiment of the invention, the coding unit 102 next transmits the words $\underline{v}$ to an interleaver 20, which supplies an "interleaved word" $\underline{v}^*$, of length 1020, by permuting the symbols of the word $$\underline{v} = (v^0, v^1, \ldots, v^{1019})$$

in the following manner:

$$\underline{v}^* = (v^0, v^{255}, v^{510}, v^{765}, v^1, v^{256}, v^{511}, v^{766}, \ldots, v^{1019}).$$

Thus an error burst affecting 4b symbols of $\underline{v}^*$ during transmission will affect at most (b+1) symbols in each of the words $\underline{u}_1$, $\underline{u}_2$, $\underline{u}_3$, and $\underline{u}_4$ (that is to say (4b+4) errors in all), as is seen according to the system of equations (4), whilst in the absence of the interleaver 20 each of these words will suffer 4b transmission errors (that is to say 16b errors in all).

The interleaver 20 next transmits the interleaved words $\underline{v}^*$ to a modulator 103. This modulator 103 associates a modulation symbol with each predetermined number of binary symbols ("bits"). Then these modulation symbols are transmitted to a recorder (or to a transmitter) 104, which inserts the symbols in a transmission channel. This channel can for example be a storage on an adequate medium such as a DVD or a magnetic disk or a magnetic tape. It can also correspond to a cable transmission or a non-cable transmission as is the case with a radio link.

The transmitted message, after having been affected by a "transmission noise" whose effect is to randomly modify or erase some of the transmitted data, reaches a reader (or a receiver) 105.

The reader (or receiver) 105 then transmits these elementary symbols to the demodulator 106, which converts them into symbols of the alphabet $F_q$. In this embodiment (where the code words $\underline{v}$ are interleaved before transmission), these received symbols are grouped together as "interleaved received words" $\underline{r}^*$, of length 1020, which are submitted to a deinterleaver 30 responsible for converting each word $\underline{r}^*$ into a "received word" (by implication: deinterleaved) $\underline{r}$, by reversing the permutation carried out by the interleaver 20.

This word $\underline{r}$ is then processed by a unit 107, which uses an error correction algorithm intended to supply a "post-associated word"

$$\underline{\hat{u}}=[\underline{\hat{u}}_1,\underline{\hat{u}}_2,\underline{\hat{u}}_3,\underline{\hat{u}}_4]$$

where the words $\underline{\hat{u}}_1$, $\underline{\hat{u}}_2$, $\underline{\hat{u}}_3$ and $\underline{\hat{u}}_4$ are all of length 255, which is an estimation of the precoded word $\underline{u}$.

According to one embodiment of the invention, the unit 107 is adapted to implement at least two algorithms, namely:
- a maximal algorithm such as the so-called "Feng-Rao" algorithm, and
- a sub-maximal algorithm, such as the one described below.

In this embodiment, a selection unit 40 determines which of the two algorithms must be used for the received word being processed, according to various predetermined parameters, which include in particular an evaluation (direct or indirect) of the channel noise.

If the selection unit 40 determines that the current transmission noise is not too high, it instructs the error correction unit 107 to implement a sub-maximal algorithm (which is therefore of lower performance but more economical than a maximal algorithm) which, in the embodiment considered here, operates as follows.

The error correction unit 107 first of all calculates, starting from the received word $\underline{r}$, a "post-received word"

$$\underline{s}=[\underline{s}_1\underline{s}_2\underline{s}_3\underline{s}_4],$$

where the words $\underline{s}_1$, $\underline{s}_2$, $\underline{s}_3$, and $\underline{s}_4$ are all of length 255, which can be interpreted as being the "noisy" version of the precoded word $\underline{u}$. This word $\underline{s}$ is therefore obtained (see the system of equations (4)) according to:

$$\underline{s}_1=\underline{r}_1+\underline{r}_2+\underline{r}_3+\underline{r}_4,$$

$$\underline{s}_2=\underline{r}_1Y_1+\underline{r}_2Y_2+\underline{r}_3Y_3+\underline{r}_4Y_4,$$

$$\underline{s}_3=\underline{r}_1Y^2{}_1+\underline{r}_2Y^2{}_2+\underline{r}_3Y^2{}_3+\underline{r}_4Y^2{}_4,$$

$$\underline{s}_4=\underline{r}_1Y^3{}_1+\underline{r}_2Y^3{}_2+\underline{r}_3Y^3{}_3+\underline{r}_4Y^3{}_4. \qquad (7a\text{-}d)$$

In order to obtain the post-associated word $\underline{\hat{u}}$, any algorithm able to correct the errors affecting coded words by means of a Reed-Solomon code is then applied independently to each of its four components. Thus there is obtained (see equations (3a-d)):
- $\underline{\hat{u}}_1$ by correcting the word $\underline{s}_1$ according to the error syndrome vector $H^{(32)} \cdot \underline{s}_1^T$,
- $\underline{\hat{u}}_2$ by correcting the word $\underline{s}_2$ according to the error syndrome vector $H^{(28)} \cdot \underline{s}_2^T$,
- $\underline{\hat{u}}_3$ by correcting the word $\underline{s}_3$ according to the error syndrome vector $H^{(24)} \cdot \underline{s}_3^T$, and
- $\underline{\hat{u}}_4$ by correcting the word $\underline{s}_4$ according to the error syndrome vector $H^{(20)} \cdot \underline{s}_4^T$.

This quadruple error correction is relatively simple and rapid by virtue of the qualities of the known algorithms adapted to Reed-Solomon codes, all the more so since words of length 255 defined on $F_{256}$ are corrected. As explained above, this greater simplicity is the counterpart of a reduction in solving capability; more precisely, having regard to the dimension of the respective parity matrices, it will be possible to correct in this way, at best, only 16 errors in $\underline{s}_1$, 14 errors in $\underline{s}_2$, 12 errors in $\underline{s}_3$, and 10 errors in $\underline{s}_4$.

If on the other hand the noise in the channel is high, that is to say if the mean transmission error rate exceeds a predetermined threshold (the selection unit 40 will for example be able to determine this by measuring the number of errors corrected on a predetermined number of previous received words, or by noting that the correction attempt described above, by means of the sub-maximal algorithm, has not succeeded), the selection unit 40 instructs the error correction unit 107 to implement the maximal algorithm. More precisely, the application of this algorithm to $\underline{r}$ supplies a code word associated with $\underline{r}$, that is to say an estimation $$\underline{\hat{v}}=[\underline{\hat{v}}_1,\underline{\hat{v}}_2,\underline{\hat{v}}_3,\underline{\hat{v}}_4]$$

where the words $\underline{\hat{v}}_1$, $\underline{\hat{v}}_2$, $\underline{\hat{v}}_3$, and $\underline{\hat{v}}_4$ are all of length 255, of the code word $\underline{v}$ transmitted. The post-associated word $$\underline{\hat{u}}=[\underline{\hat{u}}_1,\underline{\hat{u}}_2,\underline{\hat{u}}_3,\underline{\hat{u}}_4]$$

is then obtained according to the equations:

$$\underline{\hat{u}}_1=\underline{\hat{v}}_1+\underline{\hat{v}}_2+\underline{\hat{v}}_3+\underline{\hat{v}}_4,$$

$$\underline{\hat{u}}_2=\underline{\hat{v}}_1Y_1+\underline{\hat{v}}_2Y_2+\underline{\hat{v}}_3Y_3+\underline{\hat{v}}_4Y_4,$$

$$\underline{\hat{u}}_3=\underline{\hat{v}}_1Y^2{}_1+\underline{\hat{v}}_2Y^2{}_2+\underline{\hat{v}}_3Y^2{}_3+\underline{\hat{v}}_4Y^2{}_4,$$

$$\underline{\hat{u}}_4=\underline{\hat{v}}_1Y^3{}_1+\underline{\hat{v}}_2Y^3{}_2+\underline{\hat{v}}_3Y^3{}_3+\underline{\hat{v}}_4Y^3{}_4. \qquad (8a\text{-}d)$$

In the numerical example considered here, the Feng-Rao algorithm can correct up to 40 errors in the received word $\underline{r}$ of length 1020. It therefore does appreciably better than the sub-maximal algorithm, and it will be used if the quality of service so requires, but in the knowledge that this maximal algorithm is complex and therefore expensive, if only in processing time.

It should be noted that the coding ratio k/n of this algebraic geometric code is equal to 916/1020=0.898. A Reed-Solomon code defined on $F_{256}$, of length 255 and having the same coding ratio will have a dimension of 229, so that it would be necessary to code the 916 information symbols on four words belonging to this Reed-Solomon code; the minimum distance of this code being equal to 27, it will be possible to correct at maximum a number of errors equal to 13 in each of these four words; it will thus be possible to correct 52 errors in all, but only in the favorable cases (0.3% of cases) where the errors are distributed in equal numbers over these four words. This is to be compared with the performance of the code according to the invention, which is capable, as stated, of correcting all the words containing at most 40 errors when the maximal algorithm is used; when the sub-maximal algorithm is used, the code according to the invention is capable of correctly obtaining $\underline{\hat{u}}_1$ if the received word $\underline{r}$ comprises no more than 16 errors, and to correctly obtain $\underline{\hat{u}}_2$ if this received word comprises no more than 14 errors, and to correctly obtain $\underline{\hat{u}}_3$ if this received word comprises no more than 12 errors, and finally to correctly obtain $\underline{\hat{u}}_4$ if this received word comprises no more than 10 errors. It is said that this is an "unequal error protection system" or UEP.

Once the correction has ended, the unit 107 transmits the post-associated word u to a redundancy elimination unit 108, which extracts therefrom k=916 estimated information symbols by removing the redundant symbols at the positions of the word where the unit 102 placed redundant symbols during coding. Finally, these information symbols are supplied to their destination 109.

It can be considered that the units 40, 107 and 108 form conjointly a "decoder" 10.

It should be noted that, in the embodiment described above, the decoder 10 supplies an estimation of all of the k information symbols initially stored in the unit a. However, as explained in the introduction, the invention also offers the possibility of decoding only the information symbols contained in some of the (four in this example) components of the post-associated word $\hat{u}$: such embodiments can be economically advantageous for some applications, such as the transmission of images coded at source.

Figure 2:
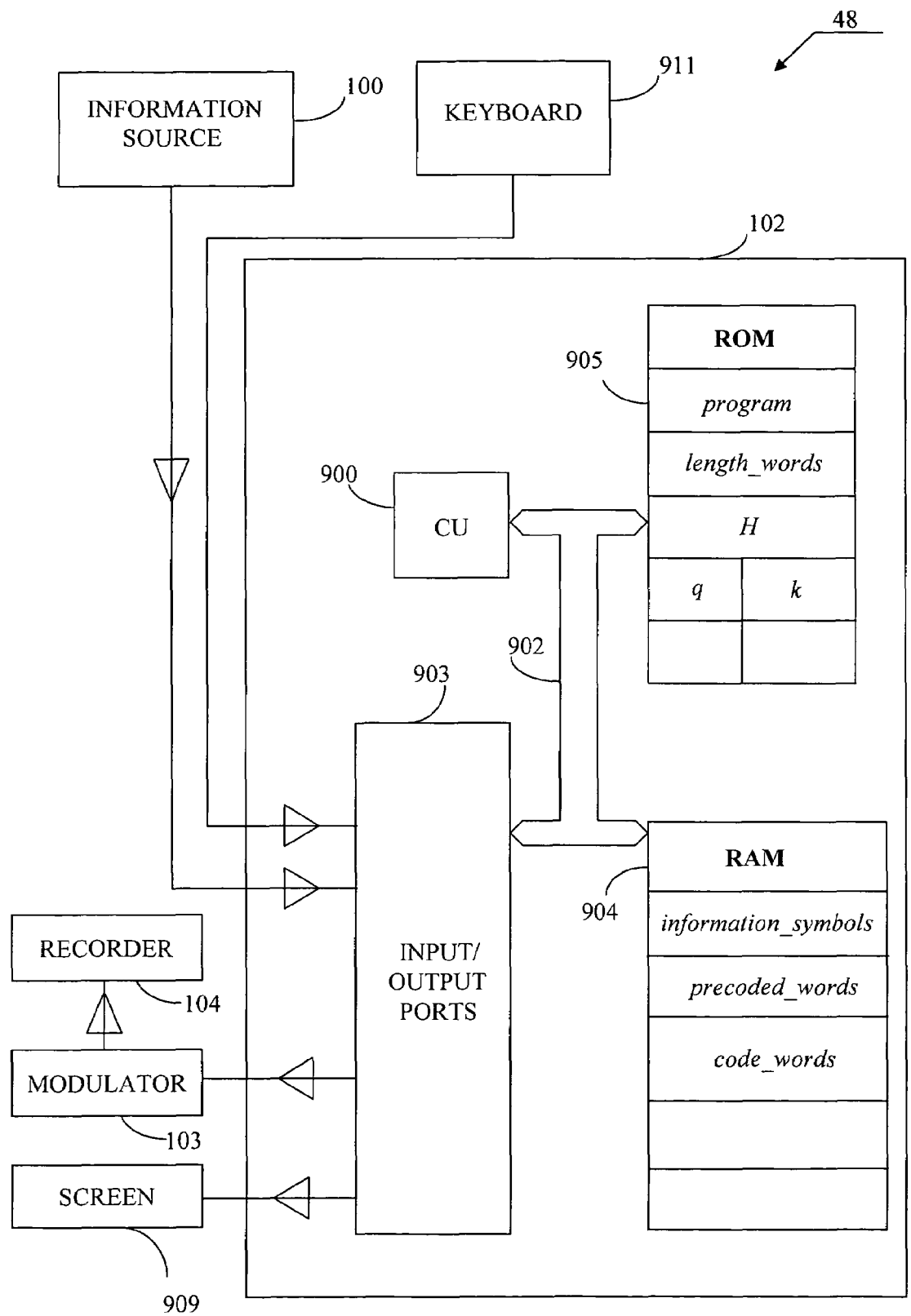
FIG. 2 depicts an information data recording apparatus comprising a coder according to the invention.

The block diagram in FIG. 2 depicts, highly schematically, an information data recording apparatus 48 incorporating the coder 102.

This apparatus 48 comprises a keyboard 911, a screen 909, an external information source 100, a modulator 103 and a modulated data recorder 104, conjointly connected to input/output ports 903 of a coding device 102 which is produced here in the form of a logic unit.

The coding device 102 comprises, connected together by an address and data bus 902:
- a central processing unit 900,
- a random access memory RAM 904,
- a read only memory 905, and
- said input/output ports 903.

Each of the elements illustrated in FIG. 2 is well known to persons skilled in the art of microcomputers and transmission systems and, more generally, information processing systems. These known elements are therefore not described here. It should be noted, however, that:
- the information source 100 could, for example, be an interface peripheral, a sensor, a demodulator, an external memory or other information processing system (not shown), and could for example supply sequences of signals representing speech, service messages or multimedia data in particular of the IP or ATM type, in the form of sequences of binary data, and
- the recorder 104 is adapted to record modulated data on a medium such as a magnetic disk.

The random access memory 904 stores data, variables and intermediate processing results in memory registers bearing, in the description, the same names as the data whose values they store. It should be noted in passing that the word "register" designates, throughout the present description, both a memory area of low capacity (a few binary data) and a memory area of large capacity (for storing an entire program) within a random access memory or a read only memory.

The random access memory 904 contains in particular the following registers:
- a register "information_symbols" in which the information symbols belonging to $F_q$ are stored,
- a register "precoded_words" in which the words u are stored, and
- a register "code_words" in which the code words v are stored before they are submitted to the modulator 103.

The read only memory 905 is adapted to store, in registers which, for convenience, have the same names as the data which they store:
- the operating program of the central processing unit 900, in a register "program",
- the length of the code words recorded, in a register "length_words",
- the cardinal of the Galois field $F_q$ serving as an alphabet for the code used, in a register "q",
- the number of information symbols serving to construct a code word, in a register "k", and
- the parity-check matrix of the code, in a register "H".

Figure 3:
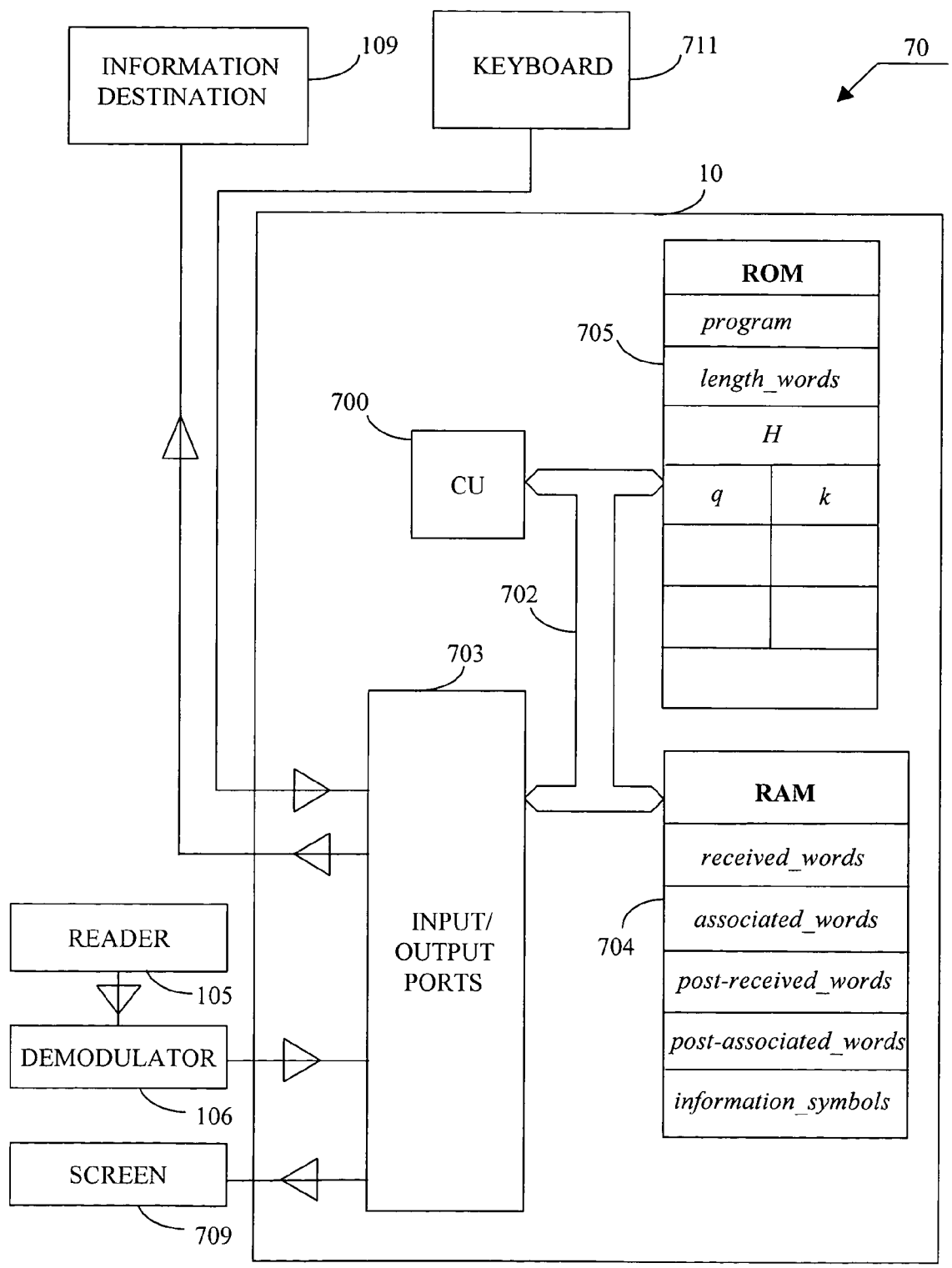
FIG. 3 depicts an information data reproduction apparatus comprising a decoder according to the invention.

The block diagram in FIG. 3 depicts, highly schematically, an information data reproduction apparatus 70 incorporating the decoder 10.

This apparatus 70 comprises a keyboard 711, a screen 709, an external information destination 109, a modulated data reader 105 and a demodulator 106, conjointly connected to input/output ports 703 of the decoder 10, which is produced here in the form of a logic unit.

The decoder 10 comprises, connected together by an address and data bus 702:
- a central processing unit 700,
- a random access memory (RAM) 704,
- a read only memory (ROM) 705, and
- said input/output ports 703.

Each of the elements illustrated in FIG. 3 is well known to persons skilled in the art of microcomputers and transmission systems and, more generally, information processing systems. These known elements are therefore not described here. It should be noted however that:
- the information destination 109 could, for example, be an interface peripheral, a display, a modulator, an external memory or other information processing system (not shown), and could be adapted to receive sequences of signals representing speech, service messages or multimedia data in particular of the IP or ATM type, in the form of sequences of binary data, and
- the reader 105 is adapted to received modulated data recorded on a medium such as a magnetic disk.

The random access memory 704 stores data, variables and intermediate processing results, in memory registers bearing, in the description, the same names as the data whose values they store. The random access memory 704 contains in particular the following registers:
- a register "words_received", in which the words received r are stored,
- a register "associated_words", in which there are stored, where applicable, the words v resulting from the correction of r by the maximal algorithm,
- a register "post-received_words", in which there are stored, where applicable, the words s obtained from r by means of the equations (7a-d),
- a register "post-associated_words", in which there are stored the words $\hat{u}$ resulting from the implementation either of the maximal algorithm or sub-maximal algorithms, and
- a register "information_symbols", in which the symbols resulting from the elimination of the redundancy are stored.

The read only memory 705 is adapted to store, in registers which, for convenience, have the same names as the data which they store:
- the operating program of the central processing unit 700, in a register "program",
- the length of the data blocks transmitted, in a register "length_blocks",
- the cardinal of the Galois field $F_q$ serving as an alphabet for the code used, in a register "q",
- the number of information symbols serving to construct a code word, in a register "k", and
- the parity-check matrix of the code, in a register "H".

It should be noted that, in some applications, it will be convenient to use the same computer device (functioning in multitask mode) for the exchange, that is to say both the transmission and reception, of signals according to the invention; in this case, the units 10 and 102 will be physically identical.

An application of the invention to the mass storage of data has been described here by way of example, but it is clear that the methods according to the invention can just as well be used within a telecommunications network, in which case the unit 105 for example could be a receiver adapted to implement a packet data transmission protocol on a radio channel.

The invention claimed is:

1. Computer implemented Method of coding information symbols according to a code defined on a Galois field $F_q$, where q is an integer greater than 2 and equal to a power of a prime number, and of length n=p(q−1), where p is an integer greater than 1, comprising steps of:

a) choosing a p-tuple of integers $(t_1, \ldots, t_p)$ such that $$q-1 > t_1 > t_2 > \ldots > t_p > 0,$$

and a p-tuple of diagonal square matrices $(Y_1, \ldots, Y_p)$ of dimension (q−1) on $F_q$ such that, for any $i(1 \leq i \leq q-1)$, the p elements in position (i,i) of these matrices $Y_1, \ldots, Y_p$ are different in pairs, b) placing the information symbols successively in p words $a_l$ of length $(q-1-t_l)$ (where l=1, ..., p), c) forming words $u_l$ (where l=1, ..., p) of length (q−1), which constitute the components of the a precoded word $\underline{u}=[\underline{u}_1 \underline{u}_2 \ldots \underline{u}_p]$, by supplementing the corresponding word $\underline{a}_l$ by means of redundant symbols so that $\underline{u}_l$ is orthogonal to a matrix $H^{(t_l)}$, where the matrices $H^{(t)}$ are defined by $H^{(t)}_{ij} = \gamma^{i(j-1)} (1 \leq i \leq t, 1 \leq j \leq q-1)$, where γ is a symbol chosen from amongst the primitive elements of $F_q$, and d) forming a code word $$\underline{v} = [\underline{v}_1 \underline{v}_2 \ldots \underline{v}_p]$$

where each word $\underline{v}(l=1, \ldots, p)$ is of length (q−1), by resolving a system of equations $$\begin{cases} \underline{v}_1 + \underline{v}_2 + \ldots + \underline{v}_p = \underline{u}_1, \\ \underline{v}_1 Y_1 + \underline{v}_2 Y_2 + \ldots + \underline{v}_p Y_p = \underline{u}_2, \\ \underline{v}_1 Y_1^2 + \underline{v}_2 Y_2^2 + \ldots + \underline{v}_p Y_p^2 = \underline{u}_3, \\ \ldots \\ \underline{v}_1 Y_1^{p-1} + \underline{v}_2 Y_2^{p-1} + \ldots + \underline{v}_p Y_p^{p-1} = \underline{u}_p. \end{cases}$$

2. The method of coding according to claim 1, in which algebraic equation in X and Y is considered such that, for any value $\gamma^{i-1}(i=1, \ldots, q-1)$ taken by X, said algebraic equation has p distinct solutions denoted $y_l(\gamma^{i-l})$ (where l=1, ..., p), and a diagonal element in position (i,i) of each of said matrices $Y_l$ is taken to be equal to $y_l(\gamma^{i-1})$.

3. The method of coding according to claim 2, futher comprising steps of:

e) applying a maximal error correction algorithm to each received word $\underline{r}$, so as to obtain an estimation $$\hat{v} = [\hat{\underline{v}}_1 \hat{\underline{v}}_2 \ldots \hat{\underline{v}}_p],$$

where each word $\hat{\underline{v}}_l(l=1, \ldots, p)$ is of length (q−1), of the corresponding transmitted word $\underline{v}$, and f) calculating at least one of the components $\hat{\underline{u}}$(where l=1, ..., p), of length (q−1), of a post-associated word $\hat{\underline{u}} = [\hat{\underline{u}}_1, \hat{\underline{u}}_2 \ldots \hat{\underline{u}}_p]$, according to:

$$\begin{cases} \hat{\underline{u}}_1 = \hat{\underline{v}}_1 + \hat{\underline{v}}_2 + \ldots + \hat{\underline{v}}_p, \\ \hat{\underline{u}}_2 = \hat{\underline{v}}_1 Y_1 + \hat{\underline{v}}_2 Y_2 + \ldots + \hat{\underline{v}}_p Y_p, \\ \hat{\underline{u}}_3 = \hat{\underline{v}}_1 Y_1^2 + \hat{\underline{v}}_2 Y_2^2 + \ldots + \hat{\underline{v}}_p Y_p^2, \\ \ldots \\ \hat{\underline{u}}_p = \hat{\underline{v}}_1 Y_1^{p-1} + \hat{\underline{v}}_2 Y_2^{p-1} + \ldots + \hat{\underline{v}}_p Y_p^{p-1}. \end{cases}$$

4. The method coding according to claim 1, in which each word $a_l$(where l=1, ..., p) represents a respective approximation of resolution of an image coded at source.

5. The method of coding according to claim 1, further comprises steps of:

e) calculating, from a word $$\underline{r} = [\underline{r}_1 \underline{r}_2 \ldots \underline{r}_p],$$

where each word $\underline{r}_l(l=1, \ldots, p)$ is of length (q−1), at least one of components $\underline{s}_l$ (where l=1, ..., p) of length (q−1), of post-received word $\underline{s} = [\underline{s}_1 \underline{s}_2 \ldots \underline{s}_p]$, according to:

$$\begin{cases} \underline{s}_1 = \underline{r}_1 + \underline{r}_2 + \ldots + \underline{r}_p, \\ \underline{s}_2 = \underline{r}_1 Y_1 + \underline{r}_2 Y_2 + \ldots + \underline{r}_p Y_p, \\ \underline{s}_3 = \underline{r}_1 Y_1^2 + \underline{r}_2 Y_2^2 + \ldots + \underline{r}_p Y_p^2, \\ \ldots \\ \underline{s}_p = \underline{r}_1 Y_1^{p-1} + \underline{r}_2 Y_2^{p-1} + \ldots + \underline{r}_p Y_p^{p-1}, \end{cases}$$

and f) calculating at least one of the components $\hat{\underline{u}}_l$[(where l=1, ..., p) of length (q−1), of a post-associated word $\hat{\underline{u}} = [\hat{\underline{u}}_1 \hat{\underline{u}}_2 \ldots \hat{\underline{u}}_p]$, and correcting the component $\underline{s}_l$ with the same l according to an error syndrome vector $H^{(t_l)}, \underline{s}_l^T$.

6. A device for coding information symbols according to a code defined on a Galois field $F_q$, where q is an integer greater than 2 and equal to a power of a prime number, and of length n=p(q−1), where p is an integer greater than 1, in which a p-tuple of integers $(t_1, \ldots, t_p)$ such that $$q-1 > t_1 > t_2 > \ldots > t_p > 0,$$

and a p-tuple of diagonal square matrices $(Y_1, \ldots, Y_p)$ of dimension (q−1) on $F_q$ such that, for any i $(1 \leq i q-1)$, p elements in position (i,i) of these matrices $Y_1, \ldots, Y_p$ are different in pairs, having been chosen, it is able to:

place the information symbols successively in p words $\underline{a}_l$ of length $(q-1-t_l)$(where l=1, ..., p), form words $\underline{u}_l$ (where l=1, ..., p) of length (q−1), which constitute components of the precoded word $\underline{u} = [\underline{u}_1 \underline{u}_2 \ldots \underline{u}_p]$, supplementing the corresponding word $a_1$ by means of redundant symbols so that $\underline{u}_1$ is orthogonal to the matrix $H^{(t_l)}$, where matrices $H^{(t)}$ are defined by $H^{(t)}_{ij} = \gamma^{i(-l)}(1 \leq i \leq t, 1 \leq j \leq q-1)$, where γ is a symbol chosen from amongst the primitive elements of $F_q$, and form a code word $$\underline{v} = [\underline{v}_1 \underline{v}_2 \ldots \underline{v}_p],$$

where each word $v_l$ (l=1, ..., p) is of length (q−1), by resolving the system of equations $$\begin{cases} \underline{v}_l + \underline{v}_2 + \ldots + \underline{v}_p = \underline{u}_l, \\ \underline{v}_1 Y_1 + \underline{v}_2 Y_2 + \ldots + \underline{v}_p Y_p = \underline{u}_2, \\ \underline{v}_1 Y_1^2 + \underline{v}_2 Y_2^2 + \ldots + \underline{v}_p Y_p^2 = \underline{u}_3, \\ \underline{v}_1 Y_1^{p-1} + \underline{v}_2 Y_2^{p-1} + \ldots + \underline{v}_p Y_p^{p-1} = \underline{u}_p. \end{cases}$$

7. The device for coding according to claim 6, wherein the device is also able to assign the value $y_l(\gamma^{i-1})$ to the diagonal element in position (i,i) of each of said matrices $Y_l$, where, for a predetermined algebraic equation in X and Y, the algebraic equation has p distinct solutions denoted $y_l(\gamma^{i-1})$ (where $l=1, \ldots, p$) for any value $\gamma^{i-1}$ ($i=1, \ldots, q-1$) taken by X.

8. A device for decoding received words $\underline{r}$ resulting from the transmission of coded words $\underline{v}$, comprising:
- an error correction unit able to apply an error correction algorithm to each word received r, so as to supply at least one component $\underline{\hat{u}}_l$ (where $l=1, \ldots, p$) of a post-associated word $\underline{\hat{u}}$, and
- a redundancy elimination unit able to remove from said the at least one component $\underline{\hat{u}}_l$ symbols situated at the positions identical to the positions of the component $\underline{u}_l$ with the same l of the corresponding precoded word $\underline{u}$, in which redundant symbols were placed at the time of coding.

9. An information data transmission apparatus comprising the device for coding according to claim 6 and a modulating data resulting from the coding the information symbols.

10. A data reception apparatus, comprising a demodulator for demodulating received data and the device for decoding according to claim 8.

11. An information data transmission apparatus, comprising the device for coding according to claim 6, an interleaver able to permute symbols of each code word
$v=(v^0, v^1 \ldots, v^{n-1})$ so as to form a word to be transmitted
$\underline{v}^* = (v^0, v^{q-1}, v^{2(q-1)}, \ldots, v^{(p-1)(q-1)}, v^1, v^q, v^{2q-1}, \ldots, v^{(p-1)(q-1)+1}, \ldots, v^{n-1})$, and a modulator for modulating the symbols of said word to be transmitted $\underline{v}^*$.

12. A data reception apparatus, comprising a demodulator for demodulating received data so as to form interleaved received words
$\underline{r}^* = (r^0, r^{q-1}, r^{2(q-1)}, \ldots, r^{(p-1)(q-1)}, r^1, r^q, r^{2q-1}, \ldots, r^{(p-1)(q-1)+1}, \ldots, r^{n-1})$, where q is an integer greater than 2 and equal to a power of a prime number, p an integer greater than 1, and $n=p(q-1)$, a deinterleaver for permuting the symbols of each interleaved received word $\underline{r}^*$ so as to form a received word $\underline{r}=(r^0, r^1, \ldots, r^{n-1})$, and the device for decoding according to claim 8.

\* \* \* \* \*